United States Patent [19]

Houdart

[11] Patent Number: 4,485,488

[45] Date of Patent: Nov. 27, 1984

[54] MICROWAVE SUBHARMONIC MIXER DEVICE

[75] Inventor: Michel Houdart, Paris, France

[73] Assignee: Thomson-CSF, Paris, France

[21] Appl. No.: 423,319

[22] Filed: Sep. 24, 1982

[30] Foreign Application Priority Data

Oct. 23, 1981 [FR] France ............................... 81 19938

[51] Int. Cl.³ .............................................. H04B 1/26
[52] U.S. Cl. .................................... 455/327; 455/330; 333/26; 333/247
[58] Field of Search .............................. 455/325–328, 455/330; 333/26, 218, 246, 247

[56] References Cited

U.S. PATENT DOCUMENTS

| 4,245,355 | 1/1981 | Pascoe | 455/326 |
| 4,310,814 | 1/1982 | Bowman | 333/128 |
| 4,320,536 | 3/1982 | Dietrich | 333/247 |
| 4,392,255 | 7/1983 | Del Giudice | 455/328 |

FOREIGN PATENT DOCUMENTS 567503 7/1979 Japan .

OTHER PUBLICATIONS

"Harmonically Pumped Stripline Down–Converter" by Schneider et al., IEEE Transactions on Microwave Theory and Techniques, vol. MTT–23, No. 3, 3/75.
"Subharmonically Pumped Millimeter-Wave Mixers" by Carlson et al., IEEE Transactions on Microwave Theory and Techniques, vol. MTT–26, No. 10, 10/78.
"94 GHZ Subharmonic Mixer Using Beam Lead Diodes" by Paul et al., 1981 IEEE MTT-S International Microwave Symposium Digest, 6/1981.
"K–Band Integrated Double–Balanced Mixer" by Ogawa et al., IEEE Transactions on Microwave Theory & Tech., vol. MTT-28, No. 3, 3/80.
"Orthomodal Type Balanced Varistor Freq. Converter" by Nemlikher et al., Telecommunications & Radio Engineering, vol. 31–32, No. 6, 6/1977.
"A New Phased-Type Image Enhanced Mixer" by Dickens et al., Proceedings International Microwave Symposium, 5/1975.
"Use These Latest Techniques to Improve Your GHZ Circuits" by Podel, EDN Electrical Design News, vol. 19, No. 1, 1974.

Primary Examiner—Jin F. Ng
Attorney, Agent, or Firm—Cushman, Darby & Cushman

[57] ABSTRACT

A wide band microwave subharmonic mixer includes a signal divider, first and second balanced varistor frequency converters, and a signal combining and dividing circuit. A local oscillator signal is applied to the signal divider, which divides the local oscillator signal into first and second signals. The first signal is applied to the first frequency converter via a coplanar transmission line, while the second signal is applied to the second frequency converter via another coplanar transmission line. The first and second frequency converters each comprise a pair of diodes. Each pair of diodes may be externally polarized by a dc polarization current. The signal combining and dividing circuit receives a microwave signal, and couples the microwave signal to the first and second frequency converters via slotted transmission lines. The first and second frequency converters produce an intermediate frequency signal which is outputted via the frequency combining and dividing circuit. Flanking ground conductors of the coplanar transmission lines may be short-circuited at a predetermined distance from the pairs of diodes.

9 Claims, 8 Drawing Figures

FIG_1-a
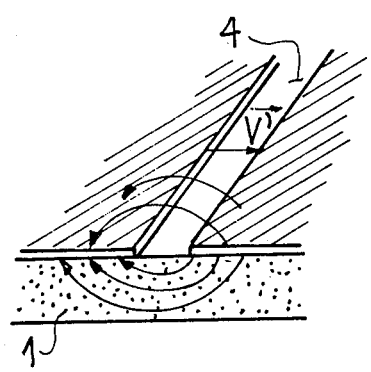
FIG_1-b
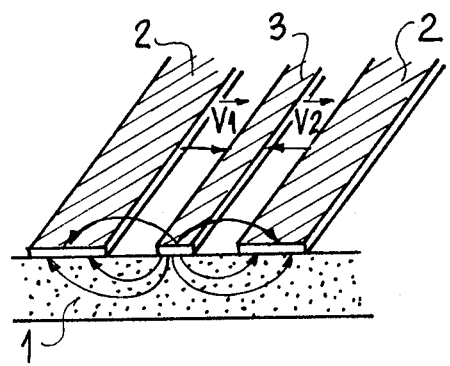
FIG_2
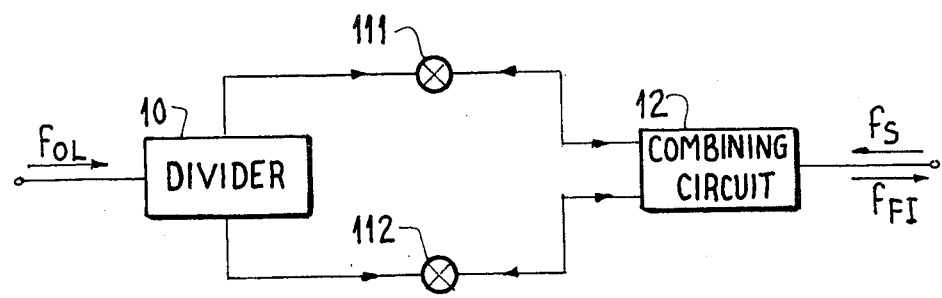

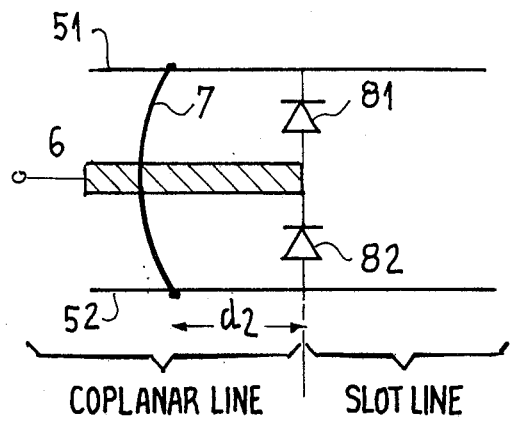
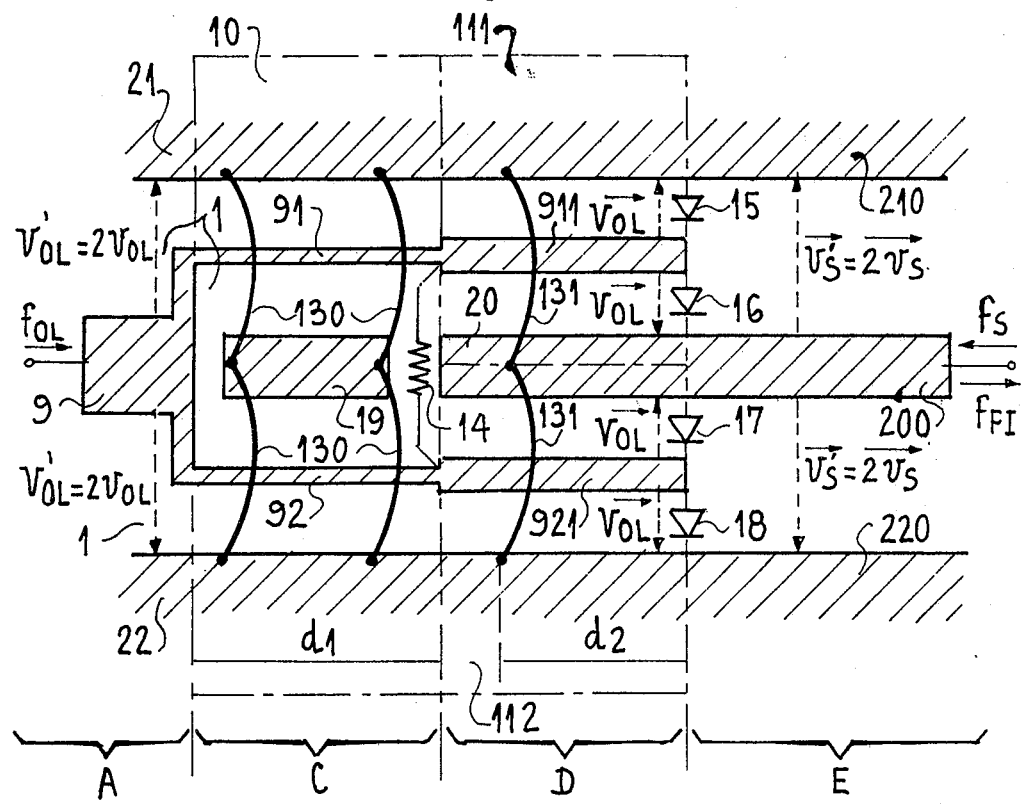

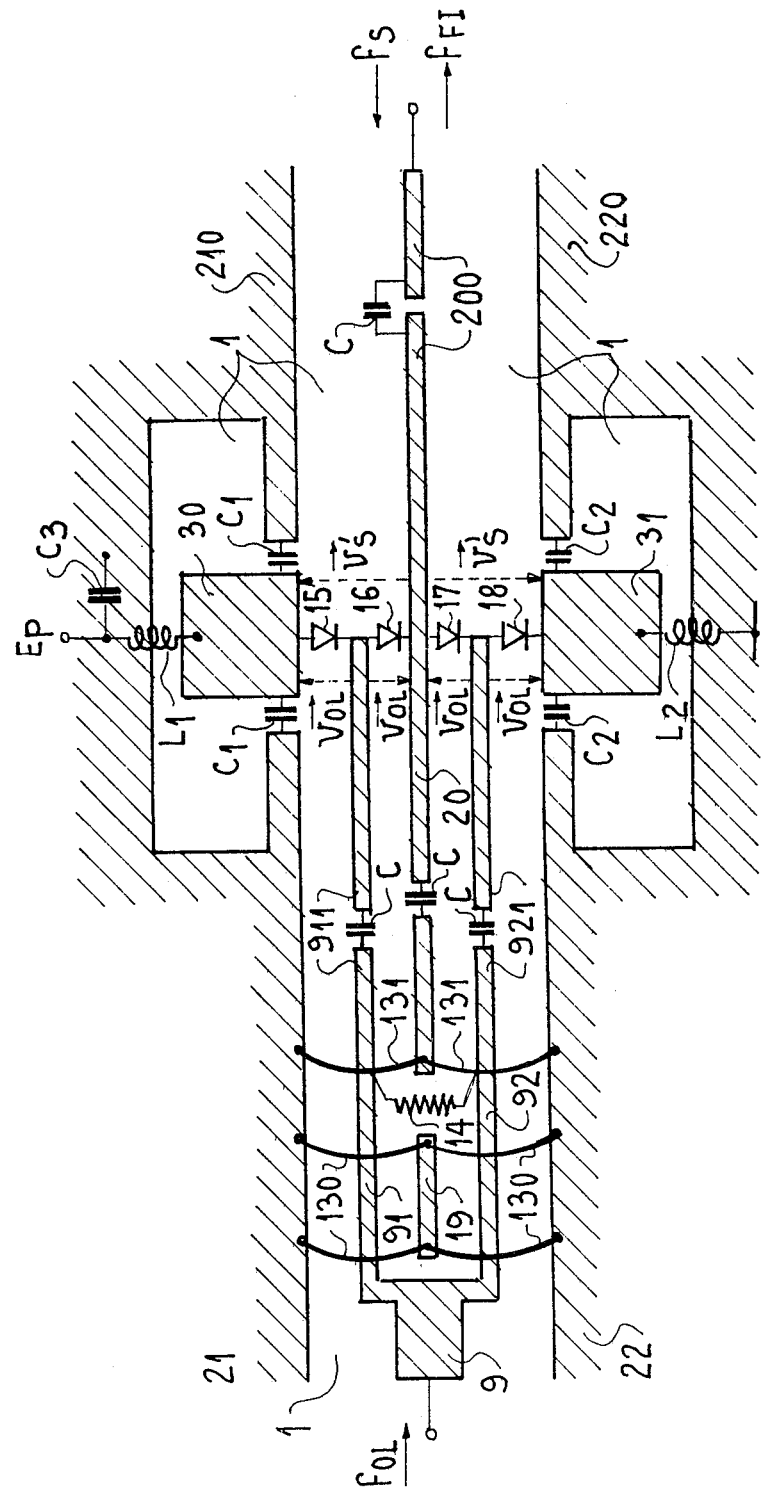
FIG_5

FIG_6
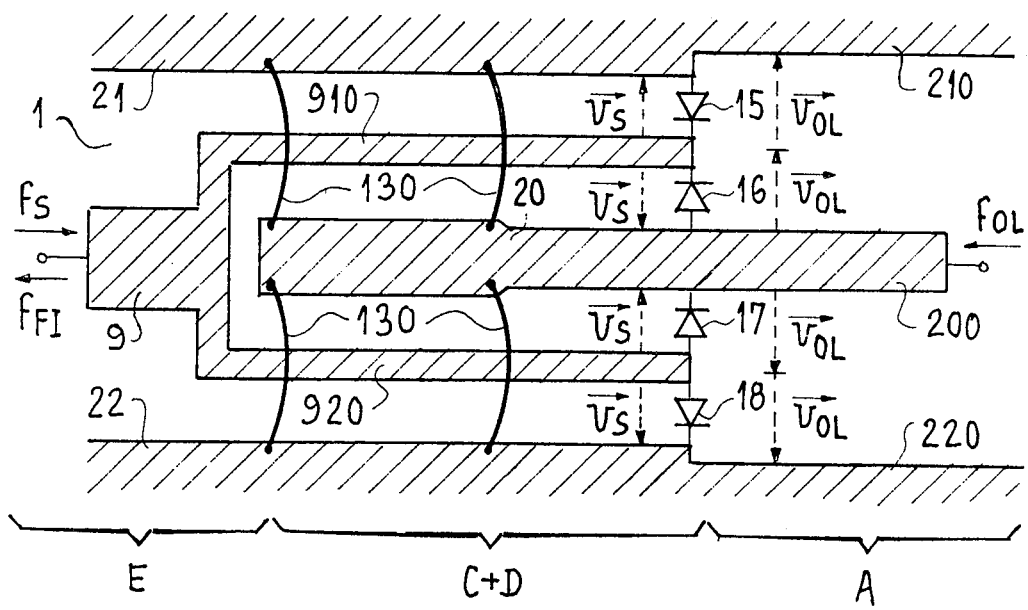
FIG_7
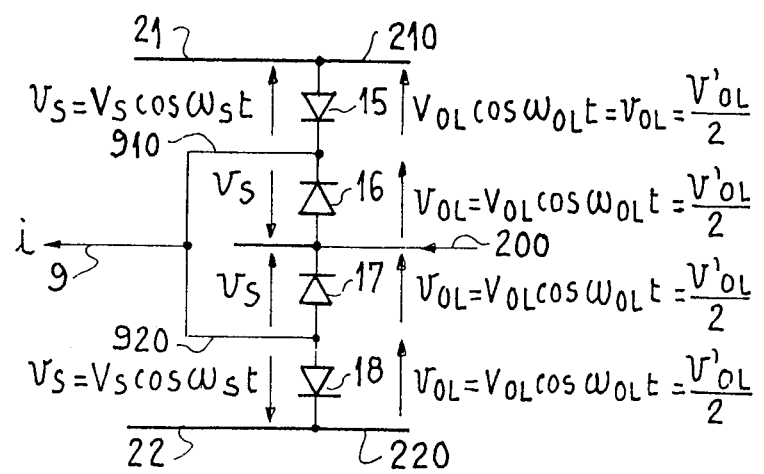

MICROWAVE SUBHARMONIC MIXER DEVICE

BACKGROUND OF THE INVENTION

The present invention relates to a microwave subharmonic mixer device.

It is often necessary to transpose the frequency $f_S$ of a signal to another and so-called intermediate frequency $f_{FI}$. The mixer devices supplied with a signal at frequency $f_S$ and with a signal at frequency $f_{OL}$ from a local oscillator, provide a signal at a fundamental frequency $f_{FI} = |f_{OL} \pm f_S|$.

It is difficult or troublesome however to produce stable local microwave oscillator sources. Consequently, it is preferable to make use—for frequency transposition—of a mixer of the subharmonic type, for example comprising a frequency doubler and a conventional mixer, making it possible to utilise a local oscillator at half the frequency, which is easier to make. The principle of a subharmonic mixer of this kind has been described by different authors in articles such as "Harmonically pumped stripline down-converter" by Martin V. Schneider and William W. Snell published in IEEE Transactions on Microwave Theory and Techniques, pages 271–275, vol. MTT-23, No. 3, March 1975. This article describes a mixer formed on a dielectric substrate suspended within a rectangular waveguide and comprising two Schotty-barrier diodes which are shunt mounted with opposite polarities at the junction of two filters, a band-pass filter at the side of the incident signal $f_S$ and a low-pass filter at the side towards the input of the local oscillator $f_{OL}$, at which the intermediate frequency output also occurs. Due to the method of decoupling between the local oscillator and the incident signal, and the technology applied, this mixer can only be used in systems with a narrow band limited by the qualities of the filtering operation and the losses present in the filters.

SUMMARY OF THE INVENTION

The present invention enables the disadvantages referred to hereabove to be sustantially eliminated and it has as an object a particularly uncomplicated balanced subharmonic wide-band mixer device.

Another object of the invention is to produce a balanced subharmonic mixer device having minimized conversion losses.

Another object of the invention is a balanced subharmonic mixer device showing a satisfactory rejection of secondary intermodulation product and a satisfactory natural decoupling between the local oscillator and signal inputs.

A microwave subharmonic mixer device according to the invention comprises first and second input lines having an asymmetrical electric field structure, a first set of transmission lines having an asymmetrical electric field structure, a second set of transmission lines having a symmetrical electric field structure, and first and second pairs of non-linear semiconductor elements, the first and second sets of transmission lines, the two input lines and the two pairs of non-linear elements being arranged in such a pattern that if a polarizing signal at frequency $f_{OL}$ is injected at the first input "local oscillator" and if a microwave signal of frequency $f_S$ is fed in at the second so-called "signal" input, a so-called intermediate frequency signal with a fundamental component corresponding to the frequency $f_{FI} = |2f_{OL} \pm f_S|$ and with no other component than those corresponding to the frequencies $|p\ f_{OL} \pm q\ f_S|$ in which p and q are even and odd integers respectively, is supplied by the second "signal" input.

BRIEF DESCRIPTION OF THE DRAWINGS

These and other objects of the invention will become more fully apparent from the following description taken together with the accompanying figures in which:

FIGS. 1a and 1b show the structure of a symmetrical propagation mode line and of an asymmetrical mode propagation line, respectively;

FIG. 2 shows the block diagram of a microwave mixer device according to the invention;

FIG. 3 shows a mixing unit forming a part of the mixer device of FIG. 2;

FIG. 4 shows a detailed embodiment of the microwave mixer device according to the invention;

FIG. 5 shows a modified form of the microwave mixer device of FIG. 4;

FIG. 6 shows another preferred embodiment of the microwave mixer device of the invention, and FIG. 7 shows the voltages and current flow in the non-linear elements of the embodiment of FIG. 6.

DETAILED DESCRIPTION OF THE PREFERRED EMBODIMENTS

Throughout the following description the frequency of local oscillator, that of the incident signal and that of the intermediate frequency output signal will be denoted by $f_{OL}$, $f_S$ and $f_{FI}$ respectively.

In the case of a so-called second order subharmonic mixer, the aim is to operate with a local oscillator signal having half the frequency of an oscillator used in a conventional mixer, and to obtain an output signal having the fundamental term or intermediate frequency in the form $f_{FI} = 2f_{OL} + f_S$ for a mixer of the "up-converter" type if the intermediate frequency greatly exceeds the incident signal frequency, and in the form $f_{FI} = |2f_{OL} - f_S|$ for a mixer of the "down-converter" type.

FIG. 1a illustrates the structure of a symmetrical propagation line of the slotted type comprising two conductors bordering a slot 4 which exposes the substrate 1 carrying the two conductors. The vector $\vec{V}$, represents the potential difference between the edges of the slot 4. FIG. 1b illustrates the structure of an asymmetrical propagation line of the coplanar type carried by a substrate of dielectric material 1 and comprising a conductor 3 flanked on either side by an earthing plane 2. The components of the electric field are symmetrical with respect to the central conductor 3 and the coplanar line may be considered as being formed by two slotlines such as that shown by FIG. 1a. The vector $\vec{V_1}$ and $\vec{V_2}$ represent the potential difference on each of the slotlines.

FIG. 2 shows a block diagram of a microwave mixer according to the invention. It comprises the combination in parallel of first and second so-called unitary mixers 111 and 112 each having a first "incident signal" input which also provides the output of the intermediate frequency signal. A first microwave circuit 10 provides equiphase division of the "local oscillator" signal into two signals intended to be fed to the first input of the first and second unitary mixers 111 and 112 respectively. A second microwave circuit or so-called combining circuit 12 supplied with the incident signal $f_S$ of an asymetrical propagation mode input, feeds said incident signal over a first and a second access means to the second input of the first and second unitary mixers 111 and 112 respectively, receives on the first and second access means a signal of intermediate frequency $f_{FI}$ supplied by the first and second unitary mixers 111 and 112 respectively and combines these two intermediate frequency signals into one signal which it delivers on an asymetrical mode output line. It causes a maximum impedance to be seen at the input "signal" of each unitary mixer 111, 112 over the whole operating frequency bands of the incident and intermediate frequency signals $f_S$ and $f_{FI}$ respectively.

The unitary mixers 111 and 112, the inputs "signal" and "local oscillator" of which show electric field structures of different symmetrical and asymmetrical types each comprise, in accordance with a known feature of the prior art, a pair of non-linear semiconductor elements which may, be way of non restrictive example, by Schottky barrier diodes.

FIG. 3 shows an unitary mixer used and denoted by 111 and 112 in the block diagram of FIG. 2 as hereinabove described, and principally applicable in the case of a mixer of the "up-converter" type.

The unitary mixers 111 and 112 of FIG. 2 have the same structure and as already stated, comprise a first input line "local oscillator" providing a propagation mode of the asymmetrical, for example coplanar, type and a second input line "signal" providing a propagation mode of the symmetrical, for example slotline, type and also acting as an output for the intermediate frequency signal. Two conductors 51 and 52 form earthing planes at reference voltage for the first input line and enflank the central conductor 6. The earthing planes of the first input line may be in the extension of the conductors bordering the slot of the second input line as in FIG. 3. Both non-linear seminconductor elements 81 and 82 formed by Schottky-barrier diodes with opposite polarities in the non-limitative embodiment of FIG. 3, are connected at the junction of the two input lines and respectively load each of the two symmetrical propagation lines 51,6 and 6,52 forming the first asymmetrical input line. A short-circuit 7 connects the conductors 51 and 52 of the first asymmetrical input line at a distance
$$d_2 = (\lambda_{FI} + \lambda_S)/8$$
upflow of the diodes 81 and 82, $\lambda_S$ and $\lambda_{FI}$ being the mean wavelengths of the frequency band of the incident signal and of the intermediate frequency output signal, respectively. The distance $d_2$ is so selected that the impedance at the diodes is as high as possible, both over the operating bands of the signal $f_S$ and of the intermediate frequency signal $f_{FI}$.

FIG. 4 shows a preferred but non-restrictive embodiment of a subharmonic mixer more especially used as an "up-converter" type and realized on a dielectric material substrate 1, the mixer comprising four sections A,C,D,E.

The section A forming the first input "local oscillator" of the mixer is of the asymmetrical type and is formed by a coplanar line in the non-limitative example of FIG. 4. This first coplanar input line comprises a central conductor 9 flanked by first and second conductors 21 and 22, each forming an earthing plane. The central conductor 9 divides into two conductors 91 and 92 with a third earthing plane 19 therebetween which is provided at the same potential as the first and second earthing planes 21 and 22 due to short-circuits 130. The conductor 91, 92 forms with the earthing planes 21 and 19, 22 and 19 respectively, a coplanar line.

These two coplanar lines thus formed are the two branches of an equiphase divider circuit denoted by reference 10 in FIG. 2 and reference C in FIG. 4 and form a Wilkinson T-circuit in the embodiment of FIG. 4. The ends of the central conductors 91 and 92 are connected via a matching resistance 14 at the distance $d_1 = \lambda_{OL}/4$ from their common junction with the central conductor 9, $\lambda_{OL}$ being the mean wavelength of the frequency band of the local oscillator $f_{OL}$. In the embodiment of FIG. 4, the Wilkinson T-circuit comprises only one section having the length $d_1$.

To increase the mixer bandwidth at the input line "local oscillator" a Wilkinson T-circuit comprising several sections of length $d_1 = \lambda_{OL}/4$ connected with matching resistance can be used.

In the embodiment of FIG. 4, the unitary microwave mixers which are respectively denoted by the references 111 and 112 in the block diagram of FIG. 2, each comprise a coplanar section D (asymmetrical propagation) and a section E forming a slotline (symmetrical propagation). For each unitary mixer 111, 112, in addition to the conductor 21, respectively 22, forming a first earthing plane, the coplanar line D comprises a central conductor 911, respectively 921, in the extension of the central conductor 91, respectively 92, of the corresponding branch of the dividing T-circuit C. Between these two conductors 911 and 921, a conductor 20 forms the second earthing plane for both unitary mixers 111 and 112. For each unitary mixer 111, 112 the slotline section E is constituted by conductors 210 and 200, respectively 220 and 200, which each form an earthing plane. The conductors 210 and 200, respectively 200 and 220, which may or may not be in prolongation of the conductors 21 and 20, respectively 20 and 22, form a slotline if each circuit is considered separately. But the same conductors 210, 200, 220 considered as a whole, form a coplanar line and consequently a propagation line of the asymmetrical type acting simultaneously as an input line for the incident microwave signal and an output line for the intermediate frequency signal. A pair of Schottky-barrier diodes 15 and 16, 17 and 18 respectively, is connected at the junction between the coplanar line D and the slotline E, as shown by FIG. 3. The diodes 15 and 16, 17 and 18 respectively, of each pair have opposite polarities. They are connected between the conductors 21 and 911 and between the conductors 911 and 20 for the first diode pair 15, 16 and between the conductors 20 and 921 and between the conductors 921 and 22 for the second diode pair 17,18, the two pairs being connected head to tail.

The so-called combining circuit also comprises short-circuits 131 between the conductors 21,20 and 22, on the coplanar lines D of the unitary mixers 111 and 112 at a distance $d_2 = (\lambda_{FI} + \lambda_S)/8$ upflow of the Schottky-barrier diodes 15,16,17,18 such that the impedance at the diodes is as high as possible in the operating frequency band of the incident signal and of the intermediate frequency. The distance $d_2$ should however be sufficiently great to prevent said short-circuits 131 from short-circuiting the Schottky-barrier diodes. Consequently, this prevents the mixer of FIG. 4 to be used as a "down-converter" type mixer when the frequency FI is particularly low.

The mixer in accordance with the invention operates as follows:

Let us assume that the local oscillator applies a voltage
$$v'_{OL} = 2V_{OL} \cos 2\pi f_{OL} t$$ to the coplanar line A and involves a voltage $v_{OL}=V_{OL}\cos 2\pi f_{OL}t$ across each Schottky diode.

Similarly, let us assume that the generator supplying the incident signal apples a voltage $v'_S=2V_S\cos 2\pi f_S t$ to each of the two slotted lines forming the coplanar signal input line E and consequently a voltage $v_S=v'/2=V_S \cos 2\pi f_S t$ across each diode. The current voltage characteristics of Schottky-barrier diode may be approximated by the relationship $i_i=I_s(e^{\alpha v_i}-1)$ in which $i_i$ is the current flowing in the diode, $v_i$ the voltage generated across it a factor which depend on the absolute temperature and the dimension of which is the inverse of a voltage, and $I_s$ the saturation current of the diode.

Let $i_1$, $i_2$, $i_3$ and $i_4$ be the currents flowing, respectively, in the respective diodes 15, 16, 17 and 18. It is assumed that the diodes have a same saturation current $I_s$.

The intermediate frequency current $i=i_1+i_2-i_3-i_4$ flowing in the central conductor 200 at the output of the mixer, can be calculated:

$$i_1=I_s[e^{\alpha(vS+vOL)}-1]$$

$$i_2=I_s[e^{\alpha(vS-vOL)}-1]$$

$$i_3=I_s[e^{\alpha(-vS+vOL)}-1]$$

$$i_4=I_s[e^{\alpha(-vS-vOL)}-1]$$

$$i=I_s[e^{\alpha vS}-e^{-\alpha vS}e^{\alpha vOL}+e^{-\alpha vOL}]$$

Let $i=4I_s\mathrm{ch}(V_{OL}\cos 2\pi(f_{OL}t))\mathrm{sh}(V_S\cos 2\pi(f_S t))$.

Resolution into a Fourier series yields:

$$i = \sum_k I_k \cos 2\pi[2n f_{OL}t \pm (2m+1)f_S t]$$

The device thus supplies a signal without components corresponding to the even harmonics of the incident signal. Furthermore, according to the theory of Bessel's functions, the level of the harmonic $2f_{OL}\mp f_S$ greatly exceeds that of the other harmonics. This is practically equivalent to a rejection in favour of the harmonic $2f_{OL}\mp f_S$. The device of FIG. 4 is consequently a real subharmonic mixer.

FIG. 5 shows another preferred embodiment of a subharmonic mixer according to the invention.

The conversion efficiency largely depends on the level of the local oscillator signal. In the case of a local oscillator providing a low level, a direct polarizing voltage needs to be fed in in series with each Schottky-barrier diode, and a compromise has to be found between the polarizing voltage and the local oscillator voltage to ensure satisfactory linearity and consequently satisfactory conversion efficiency. The subharmonic mixer obtained, illustrated by FIG. 5, may also act as a "down-converter" in which the intermediate frequence $f_{FI}=|2f_{OL}-f_S|$ may be very low and require the infeed of a polarizing voltage.

The mixer shown by FIG. 5 is a variant of the embodiment of FIG. 4. The same elements are denoted by the same references. The polarizing current is fed in via the input terminal $E_p$, insulated from the earthing plane 21 by a capacitance C3, flows across the choking inductance L1 and the conductor 30 connected to the earthing plane 21 via capacitances C1. The diodes 15, 16, 17, 18 have the same arrangement as in FIG. 4, but between the conductors 30 and 911, 911 and 20, 20 and 921, 921 and 31 respectively, the conductor 31 being connected to the earthing plane 22 via capacitances C2. The polarizing current then flows across the choking inductance L2 connecting the conductor 31 to the earthing plane 22.

Each of the conductors 20, 911, 921 is formed by several sections interconnected by series capacitances C.

The values of the capacitances C, C1, C2 are so selected that they form a short-circuit in the frequency bands of the local oscillator, of the incident signal and of the intermediate frequency, output signal. Their impedance is infinite for dc-current. Conversely, the inductances L1 and L2 form short-circuits for dc-current.

The four Schottky diodes are consequently satisfactorily polarized by the dc-voltage fed in at $E_p$.

The bandwidth of the device of FIGS. 4 and 5 is limited by several factors:

the matching capabilities of the various inputs and outputs linked on the one hand to the technology applied for conducting areas and on the other hand to the quality of the semiconductor elements, and in particular to the capacity of the Schottky-barrier diodes, the definition of the combining circuit which causes a purely reactive impedance as high as possible over the frequency bands of the incidence signal and of the intermediate frequency output signal to be shunt mounted on each pair of diodes, the bandwidth of the dividing circuit.

FIG. 6 shows another preferred embodiment of the subharmonic mixer according to the invention. Such a mixer can operate as an "up-converter" or "down-converter" mixer.

Two conductors 21, 22 form earthing planes on a dielectric material of substrate 1. Between these two conductors 21, 22 a central conductor 9 divides into first and second branches 910 and 920 of the same length d, with a third conductor 20 therebetween forming an earthing plane and brought to the same potential as the first and second earthing planes by means of short-circuits 130. At the ends of conductors 910 and 920 two pairs of parallel Schottky-barrier diodes 15, 16 and 17, 18 are anti-parallel connected, each diode connecting an earthing plane to a central conductor.

In the case of FIG. 6, the diodes 15, 16, 17, 18 are directed respectively, from the first conductor 21 forming an earthing plane towards the first branch 910 for diode 15, from the third conductor 20 forming an earthing plane towards the first branch 910 for diode 16, from the second branch 920 towards the third conductor 20 forming an earthing plane for diode 17, and towards the conductor 21 forming an earthing plane for diode 18. The two conductors 210, 220 forming earthing planes and the conductor 200 therebetween form a coplanar line used as first mixer input line for the local oscillator, whereas the coplanar line formed by the two earthing planes 21, 22 with the central conductor 9 therebetween forms the second mixer input line for the incident signal and the intermediate frequency output line. The dividing circuit in the embodiment of FIG. 6 is a sample T junction. The conductors 200, 210 and 220, may extend in prolongation of conductors 20, 21 and 22 respectively.

The device illustrated in FIG. 6 operates as follows when also referring to FIG. 7.

Let us assume that the local oscillator supplying the coplanar line A applies to each constituent slotline 210, 200 and 200, 220, a voltage $v'_{OL}=2V_{OL}\cos 2\pi F_{OL}t$, from the central conductor 200 towards each conductor 210,220 respectively forming an earthing plane.

The voltage applied to each Schottky-barrier diode is thus equal to: $v_{OL} = v'_{OL} \cos 2\pi f_{OL} t$.

Similarly, let us assume that the generator supplying the incident signal fed to the input coplanar line E formed by the conductors 21, 9, 22, applies to each Schottky-barried diode 15, 16, 17, 18 a voltage having the form $v_S = V_S \cos 2\pi f_S t$ from the central conductor 910 or 920 towards the conductor 21, 20 or 22 forming an earthing plane.

In FIGS. 6 and 7 the total voltages $v_1$, $v_2$, $v_3$, $v_4$ respectively applied to the diodes 15, 16, 17, 18 are equal to:

$$v_1 = v_S + v_{OL}$$

$$v_2 = v_S - v_{OL}$$

$$v_3 = v_{OL} - v_S$$

$$v_4 = -v_S - v_{OL}$$

when taking account of the direction of the voltages applied by the incident signal and by the local oscillator with respect to the diode polarity.

As already stated above to explain the operation of the embodiment of FIG. 4, the current flowing in each diode may be approximated by the relationship:

$$i_i = I_s[e^{\alpha v_i} - 1]$$

Assuming the four diodes 15, 16, 17, 18 to have an identical saturation current $I_s$, i assuming the corresponding values 1, 2, 3, 4 for each diode 15, 16, 17, 18 respectively, the output current i in the central conductor 9 is equal to $i = i_1 + i_2 - i_3 - i_4$, in the diode arrangement of the embodiment of FIG. 6.

Consequently it is the same case as for the embodiment of FIG. 4. After decomposition into Fourier's series, the output current is equal to:

$$i = \sum_k I_k \cos 2\pi[2_p f_{OL} t \pm (2q + 1) f_S t]$$

and does not comprise any component corresponding to the even order harmonics of the incident signal.

In the same manner, the level of the components $[2f_{OL} + f_S]$ greatly exceeding that of the other components, involves a rejection of the other components in favour of the fundamental component $[2f_{OL} + f_S]$.

The device illustrated by the figure is thus a real subharmonic mixer of the "dual" type without the disadvantage of the embodiments of FIGS. 4 and 5 which are particularly appropriate for operating as an "up converter" and "down-converter", respectively. Furthermore it is quite simple: As a matter of fact, the divider 10 and the combining circuit 12 of the FIG. 6 are combined in one circuit connected between the second coplanar input line 21,9, 22 for the incident signal also supplying the intermediate frequency signal, and the Schottky barrier diodes. On the other hand, each Schottky barrier diode loads each of the dividers branches respectively. The insulation between channels, as in the case of FIGS. 4 and 5, is no longer required. Finally, the intermediate frequency signal no longer flows at the slotline side as in FIGS. 4 and 5 but at the coplanar side of the unitary mixers 111, 112 defined with reference to FIG. 2. Whereas in the case of FIGS. 4 and 5, the short-circuits 131 at the distance $d_2$ from the diodes make it possible to have an impedance as high as possible over the operating frequency bands of the incident signal and of the intermediate frequency output signal, these short-circuits 131 are no longer necessary due to the design of the combining circuit and of the intermediate frequency output line. The obstacle to a dual type operation like in the embodiments of FIGS. 4 and 5 has consequently been removed.

In the case of a perfect symmetry of the device according to FIG. 4, 5 or 6, infinite decoupling is evidently obtained between the "signal" and "local oscillator" input lines.

It is known by one skilled in the art how to determine the widths and lengths of the various conducting sections so as to make the useful frequency band of the device as wide as possible.

Evidently two subharmonic mixers according to the invention can be combined to an image rejection mixer.

The present invention is applicable to microwave circuits requiring a frequency transposition.

What is claimed is:

1. A wide band microwave subharmonic mixer comprising:
    signal dividing means, responsive to a local oscillator signal, for dividing said local oscillator into a first signal and a second signal;
    signal dividing and combining means for receiving a microwave signal and for outputting an intermediate frequency signal;
    first and second balanced frequency converting means, each coupled to said signal dividing and combining means, said first converting means responsive to said first signal, said second converting means responsive to said second signal, said first and second converting means for converting said first and second signals, respectively, and said microwave signal into said intermediate frequency signal, said first and second converting means each comprising a pair of diodes;
    a dielectric substrate;
    coplanar transmission lines means, disposed on said substrate, for coupling said signal dividing means to said first and second converting means; and
    slotted transmission line means, disposed on said substrate, for coupling said first and second converting means to said signal dividing and combining means.

2. A wide band microwave subharmonic mixer comprising:
    signal dividing means, adapted to receive a local oscillator signal, for dividing said local oscillator signal into a first signal and a second signal;
    signal dividing and combining means, adapted to receive a microwave signal and responsive to a first mixed signal and to a second mixed signal, for combining said first and second mixed signals to form an intermediate frequency signal;
    first mixing means, responsive to said first signal and to said microwave signal, for producing said first mixed signal;
    second mixing means, responsive to said second signal and to said microwave signal, for producing said second mixed signal;
    first coplanar transmission line means for coupling said first mixing means to said signal dividing means;

second coplanar transmission line means for coupling said second mixing means to said signal dividing means;

first slotted transmission line means for coupling said first mixing means to said signal dividing and combining means; and second slotted transmission line means for coupling said second mixing means to said signal dividing and combining means.

3. A mixer as in claim 2 wherein said first and second mixing means each include a pair of diodes.

4. A mixer as in claim 3 wherein said pair of diodes of said first mixing means and said pair of diodes of said second mixing means are each connected in antiparallel.

5. A mixer as in claim 4 wherein said signal dividing and combining means includes means for defining a T coupler coupling said first and second slotted transmission line means together and to said microwave signal.

6. A mixer as in claim 3 wherein:

said first mixing means further includes first capacitor means, connecting said pair of diodes of said first mixing means to said first coplanar transmission line means, for isolating dc potentials present on said pair of diodes of said first mixing means from said first coplanar transmission line means;

said second mixing means further includes second capacitor means, connecting said pair of diodes of said second mixing means to said second coplanar transmission lines means, for isolating dc potentials present on said pair of diodes of said second mixing means from said second coplanar transmission line means; and said pairs of diodes of said first and second mixing means are each polarized by an externally-applied dc polarizing current.

7. A mixer as in claim 2 wherein:

said signal dividing means comprises a Wilkinson coupler;

said first coplanar transmission line means includes a first flanking conductor connected to ground potential;

said second coplanar transmission line means includes a second flanking conductor connected to ground potential; and said mixer further includes means for short-circuiting said first and second flanking ground conductors together at a distance $D=(F_i+s)/8$, said distance D measured from both said first and said second mixing means, wherein $F_i$ and s are respectively the wavelengths of said intermediate frequency signal and said microwave signal.

8. A microwave subharmonic mixer device according to claim 3, wherein each of said diodes are Schottky-barrier diodes.

9. A microwave subharmonic mixer device according to claim 8, wherein said Schottky diodes are polarized by an external dc-voltage.

* * * * *